US009865963B2

(12) United States Patent
Poole

(10) Patent No.: US 9,865,963 B2
(45) Date of Patent: Jan. 9, 2018

(54) HEAT DISSIPATION DEVICE FOR AN ELECTRICAL METER SOCKET

(71) Applicant: Donald William Poole, Acworth, GA (US)

(72) Inventor: Donald William Poole, Acworth, GA (US)

(*) Notice: Subject to any disclaimer, the term of this patent is extended or adjusted under 35 U.S.C. 154(b) by 26 days.

(21) Appl. No.: 14/817,308

(22) Filed: Aug. 4, 2015

(65) Prior Publication Data

US 2017/0042059 A1    Feb. 9, 2017

(51) Int. Cl.

| | |
|---|---|
| *G06F 1/16* | (2006.01) |
| *H05K 5/00* | (2006.01) |
| *H05K 7/00* | (2006.01) |
| *H01R 13/533* | (2006.01) |
| *G01R 21/133* | (2006.01) |
| *G01R 11/04* | (2006.01) |
| *H02B 1/03* | (2006.01) |

(52) U.S. Cl.
CPC ......... *H01R 13/533* (2013.01); *G01R 11/04* (2013.01); *G01R 21/133* (2013.01); *H02B 1/03* (2013.01)

(58) Field of Classification Search
CPC .......... G06F 1/16; G06F 1/189; H05K 7/1401
USPC ................ 361/807, 810, 641–658, 602, 622
See application file for complete search history.

(56) References Cited

U.S. PATENT DOCUMENTS

| | | | | |
|---|---|---|---|---|
| 4,133,021 A * | 1/1979 | King | .................. | H02B 1/50 |
| | | | | 174/38 |
| 4,327,396 A * | 4/1982 | Schacht | ................. | H02B 1/305 |
| | | | | 361/648 |
| 5,088,004 A * | 2/1992 | Howell | .................... | H02B 1/03 |
| | | | | 361/668 |
| 7,450,369 B2 * | 11/2008 | Wilkie, II | ................ | H02B 1/42 |
| | | | | 200/50.28 |
| 2006/0082955 A1 * | 4/2006 | Robinson | ............... | G01R 11/04 |
| | | | | 361/663 |

* cited by examiner

*Primary Examiner* — Anthony Haughton
(74) *Attorney, Agent, or Firm* — Thomas | Horstemeyer, LLP

(57) ABSTRACT

A heat dissipation device is presented for an electrical meter socket. The heat dissipation device includes a conduit with a first end configured to be mounted to a first opening in a housing of the electrical meter socket. The heat dissipation device includes a vent cap to cover a second end of the conduit, and may include one or more optional apertures to dissipate heat from the electrical meter socket. The heat dissipation device can also include mesh or screen to keep insects out of the device. An electrical meter socket system is also presented, including the electrical meter socket a heat dissipation device and a connector to connect the device to an opening in a housing of the socket. A method is also presented, for dissipating heat from an electrical meter socket.

20 Claims, 4 Drawing Sheets

HEAT DISSIPATION DEVICE FOR AN ELECTRICAL METER SOCKET

FIELD

Embodiments relate to electrical meter sockets, and more particularly to a heat dissipation device for an electrical meter socket.

BACKGROUND

Electrical meters are used to measure energy usage. For example, an electrical meter may be connected to power lines entering a building to measure energy usage in the building. An electrical meter socket mounted on the building is used to connect the electrical meter to the power lines. The electrical meter socket includes a plurality of terminals to which the power lines are connected. The electrical meter socket also has a jaw contact corresponding to each terminal for receiving blade connectors extending from the electric meter.

As an electrical meter socket ages, the jaw contacts may be repeatedly connected and disconnected from the blade connectors of the electrical meter. This eventually causes degraded contact between the jaw contacts and the blade connectors over time, resulting in arcing and heat generation within the electrical meter socket.

Modern advanced metering infrastructure, also referred to as automated metering infrastructure (AMI) meters (smart meters) include temperature sensors which measure the temperature within the electrical meter socket. They generate an alarm if the measured temperature exceeds a temperature threshold. Smart meters are limited to detection of internal meter socket temperatures in excess of a temperature threshold and sending an alarm if an excessive temperature is detected. They are prone, however, to issuing false alarms, resulting in unnecessary service calls. A false alarm can be due to any one or more of a number of reasons, including for example direct sunlight especially during summer months, and lack of ventilation.

It would be advantageous to provide a heat dissipation device for electrical meter sockets, which dissipates heat energy from within the electrical meter socket and thus prevents the internal temperature from exceeding the temperature threshold, and avoids unnecessary service calls to the meter location.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
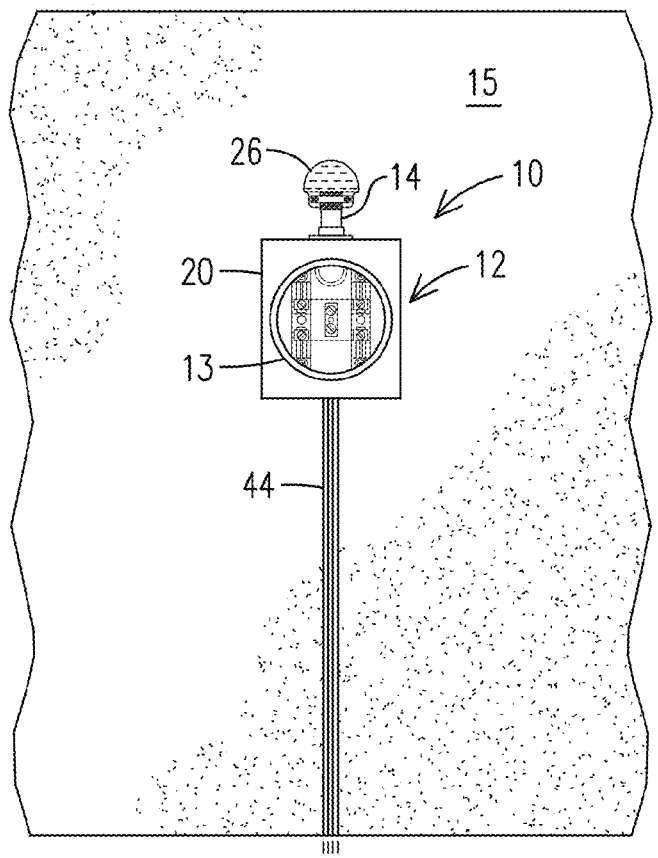
FIG. 1 is a plan view of a heat dissipation device for an electrical meter socket connected to an underground power source.

Described below are various embodiments of the present systems and methods for my heat dissipation device for an electrical meter socket. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

DISCUSSION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DESCRIPTION

Based on the aforementioned shortcomings of presently available systems, it would be advantageous to provide a heat dissipation device for electrical meter sockets as described herein, which can dissipate heat energy from within the electrical meter socket. It can, thus, alleviate the tendency of the internal temperature within the socket from exceeding a temperature threshold and causing a false alarm. Unnecessary service calls to the meter location can then be reduced or eliminated altogether.

Such a heat dissipation device for an electrical meter socket is described herein. In an embodiment, the heat dissipation device can include a conduit configured at one end (a first end) to be mounted or secured to an opening in a housing of the electrical meter socket. In an aspect, the conduit can be a hollow tube or pipe. When mounted to the socket, the hollow interior portion of the conduit can be in communication with the interior of the socket. The conduit may have a mesh or a screen on or within a second end the first end of the conduit and opposite the housing of the electrical meter socket when the first end of the conduit is secured thereto. A vent cap can be configured to cover the second end of the conduit. The vent cap may include one or more apertures to allow heat to dissipate from an interior of the electrical meter socket out through the interior hollow portion of the conduit and out through the one or more apertures in the vent cap. In one or more aspects, the apertures in the vent cap can be optional and can take the form of perforations, slots, slits, hales, and the like. The mesh or screen can be optional. It may also be positioned to cover the apertures of the vent cap instead of positioned within the second end of the conduit. In one or more aspects, at least a portion of the conduit can be disposed in a generally vertical relationship to the housing of the electrical meter socket.

The heat dissipation device can be secured to the electrical meter socket in any one of a number of ways. A device can be included to secure the first end of the conduit of the heat dissipation device to the electrical meter socket. In an aspect the securing device can include a hub having a central opening therein configured to secure the first end of the conduit to the electrical meter socket. The housing of the electrical meter socket can have an opening in a wall thereof to which the first end of the conduit can be secured allowing the hollow interior portion of the conduit to communicate with the interior of the socket. The housing of the socket can also include a knock-out piece or section in one of its exterior walls that can be removed to create such an opening. In an aspect, the hub can include a threaded opening configured to be mounted to an opening in the housing of the socket. In some embodiments, the first end of the conduit can be threadably secured to the threaded opening of the hub. For example, the first end of the conduit can have an outer thread with a pitch matching an inner thread on the opening of the hub, and the conduit may be turned to screw in the conduit in to the hub. In an aspect, an opening can be formed in the top portion of the housing or the top portion of the housing may include the opening or may include a knock-out piece that can be knocked out to form the opening, and a bottom portion of the housing opposite from the top portion may define a second opening. The second opening may receive electrical cables from of an underground power source.

In some embodiments, a clamp can be used to secure the vent cap to the second end of the conduit. The clamp can include a band to encircle a portion of a circumference of the conduit. The band can include holes therein, for example in opposite ends, and a fastener passed through the openings of the band. In some embodiments, the fasteners can pass into the vent cap. The mesh or screen may be extended from the second end to between the band and the pipe to secure the mesh or screen to the conduit with the clamp. A second clamp may secure the mesh to the second end of the conduit.

The one or more apertures are optional. If included, they may extend from a first end at an outer surface of the vent cap to a second end at an inner surface of the vent cap. The one or more apertures may be oriented from the first end to the second end in a direction opposite to the second end of the pipe covered by the vent cap. The one or more apertures may be sized with a width in a range of ¼"-½". The one or more apertures may be oriented at an angle in a range of 30-60 degrees relative to a base of the vent cap. The conduit may have an outer diameter in a range of 1"-3". The conduit may also have a height in a range of 3-5".

FIG. 1 illustrates one embodiment of an electrical meter socket system including a heat dissipation device 10 of the present disclosure attached to an electrical meter socket 12. The socket 12 can be secured to a side of a building 15, such as a residential or commercial building. A power company may install one or more electrical meter sockets 12 on one or more houses that obtain service from the power company. For example, a power company may install an electrical meter socket 12 on every house in an area that the power company provides service so that the power company can read the power usage from all of the power company's clients. An electrical meter 13 is typically positioned within a housing 20 of the electrical meter socket 12. The electrical meter socket 12 connects the electrical meter 13 to power lines 44 from an underground power source 46, such as an underground padmount transformer, as appreciated by one skilled in the art.

In a non-limiting example, the heat dissipation device 10 is used with electrical meter sockets that are connected to an underground power source. However, the heat dissipation device 10 may be used with electrical meter sockets that are connected to an overhead power source. The heat dissipation device 10 may be installed on an existing electrical meter socket 12, for example, a power company may retrofit all existing electrical meter sockets 12 with a heat dissipation device 10 to reduce heat on the electrical meter sockets 12. The heat dissipation device 10 may also be installed on a new electrical meter socket 12. For example, a manufacturing process to build electrical meter socket 12 may include constructing a heat dissipation device 10 as described herein, and installing it onto electrical meter socket 12 prior to shipping the products.

Figure 2A:
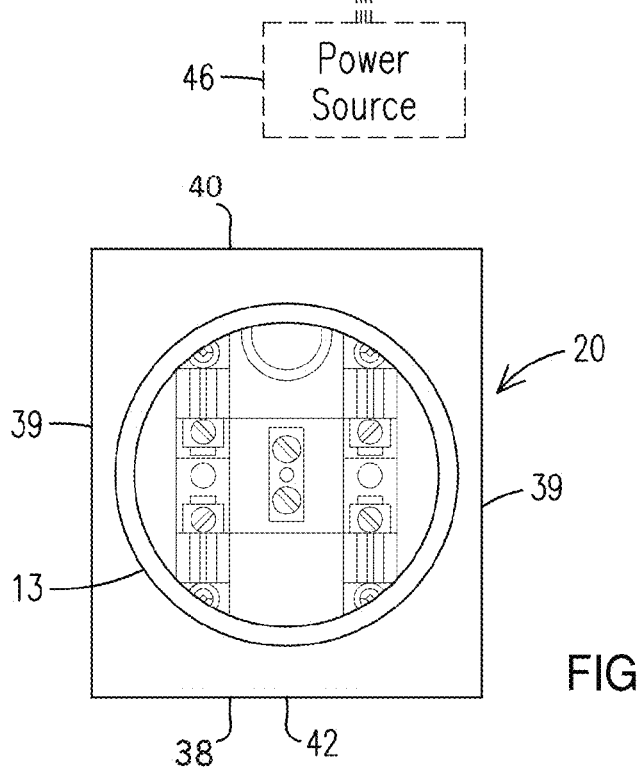
FIGS. 2A-2D show a respective front view, side view, bottom view and top view of a housing of the electrical meter socket shown in FIG. 1.
Figure 2B:
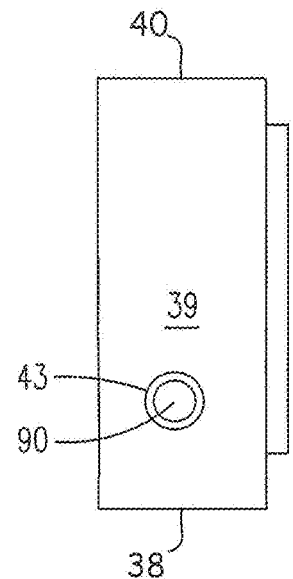
Figure 2C:
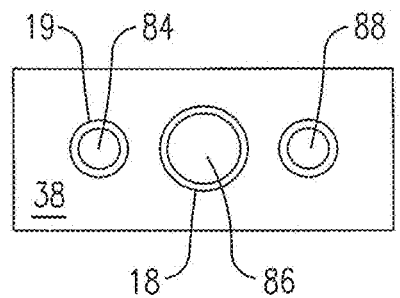
Figure 2D:
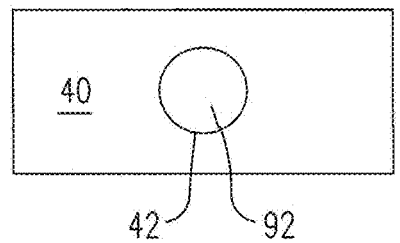

FIGS. 2A-2D illustrate an embodiment of the housing 20 of the electrical meter socket 12, including a top portion 40, a bottom portion 38, and a side portion 39. These figures are not necessarily to scale. For example, a 200 A box would be taller and wider than illustrated in FIG. 2A. As illustrated in FIG. 2C, knock-out pieces or plates 84, 86, and 88 may be provided along the bottom portion 38, and a first opening 18 may be formed in the bottom portion 38 by removing the center knock-out plate 86. As illustrated in FIG. 2D, an opening 92 may be formed in or provided along the top portion 40. In some aspects, the opening 92 may need to be formed in the top portion 40. In other aspects, the top portion 40 may include opening 92, or the opening 92 can be formed by removing a knock-out piece or plate. In some aspects, the opening 92 may be formed by cutting out material from the top portion 40 in the absence of a knock-out piece or plate. As appreciated by one skilled in the art, the power lines 44 from the underground power source 46 (FIG. 1) are passed through the opening 18 in the bottom end portion 38 of the housing 20, to establish an underground service connection. Although the embodiment of FIGS. 2A-2D depicts that the opening 18 is formed in the housing 20 by removing knock-out plate 86 in a non-limiting example the opening 18 may alternatively be formed by cutting out material from the bottom portion 38 in the absence of knock-out plate(s).

Figure 3:
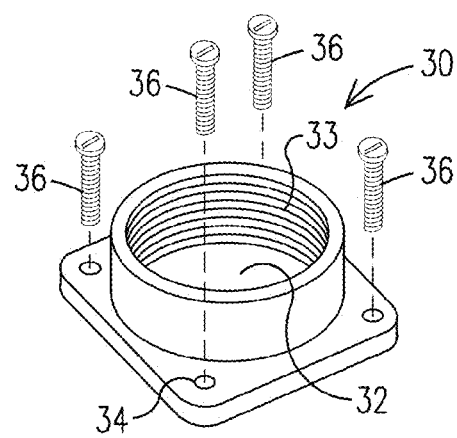
FIG. 3 is a perspective view of a hub suitable for attachment to the housing of the electrical meter socket in FIG. 1.
Figure 4:
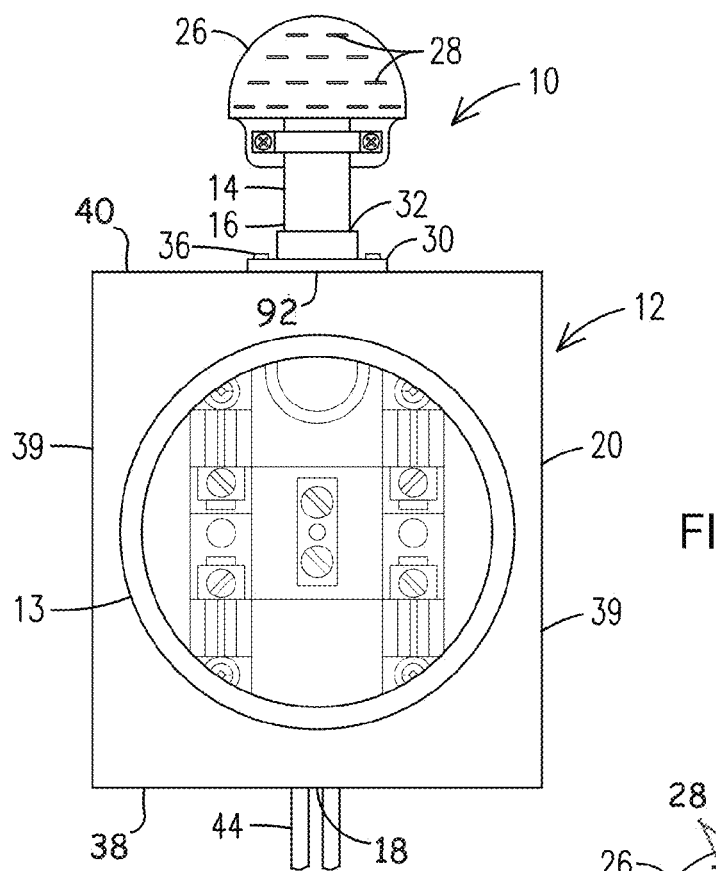
FIG. 4 is a front plan view of a heat dissipation device of the present disclosure attached to the electrical meter socket of FIG. 1.

FIG. 3 illustrates one embodiment of a connector 30 or a device for connecting our heat dissipation device to an opening in housing 20, such as opening 92 in the top portion 40. In one or more aspects, the connector 30 can be a conventional hub with a threaded opening 32 having internal threads 33. As illustrated in FIG. 4, the connector 30 may be mounted to the opening 92 in the top portion 40 of the housing 20 of the electrical meter socket 12. In a non-limiting example, fasteners 36 (FIG. 3) may be passed through holes 34 in the connector 30 and secured through the top portion 40 of the housing 20, to secure the connector 30 to the top portion 40 of the housing 20 at the opening 92. The connector 30 may be secured to the top portion 40 of the housing 20 using any means appreciated by one skilled in the art. For example, hub 30 can be attached to housing 20 by a plurality of screws as depicted in FIG. 3. Hub 30 can also be welded, riveted, glued, or compression fit to housing 20.

As illustrated in the embodiment of FIG. 4, the heat dissipation device 10 can be attached to the electrical meter socket 12. The heat dissipation device 10 can include a conduit 14 with a first end 16 that can be mounted to the opening 92. In one or more aspects, the conduit can be a pipe or a hollow tube. The first end 16 of the conduit 14 can be mounted to the connector 30, for example to the threaded opening 32 of the hub 30, which may be mounted to the opening 92. In a non-limiting example, the first end 16 of the conduit 14 may include external threads that are threadably secured to the internal threads 33 (FIG. 3) of the threaded opening 32 in the connector 30. In a non-limiting example, an outer diameter of the conduit 14 and an inner diameter of the threaded opening 32 may be 2" or within in a range of 1"-3." In another non-limiting example, the conduit 14 may be made from aluminum or stainless steel material. Although the embodiment of FIG. 4 depicts that the conduit 14 is mounted to the opening 92 using a hub 30, in a non-limiting example conduit 14 may be directly mounted to the opening 92 in the top portion 40 of the housing 20, without a connector 30. Further, where a connector 30 is used, one skilled in the art will recognize other types of connectors can be used besides the hub depicted in FIGS. 3 and 4. Although FIG. 4 depicts the heat dissipation device 10 mounted to the opening 92 the electrical meter socket 12 that is connected to an underground power source 46 (FIG. 1) of an underground service connection, the heat dissipation device 10 is not limited to this embodiment of a socket 12.

Figure 5:
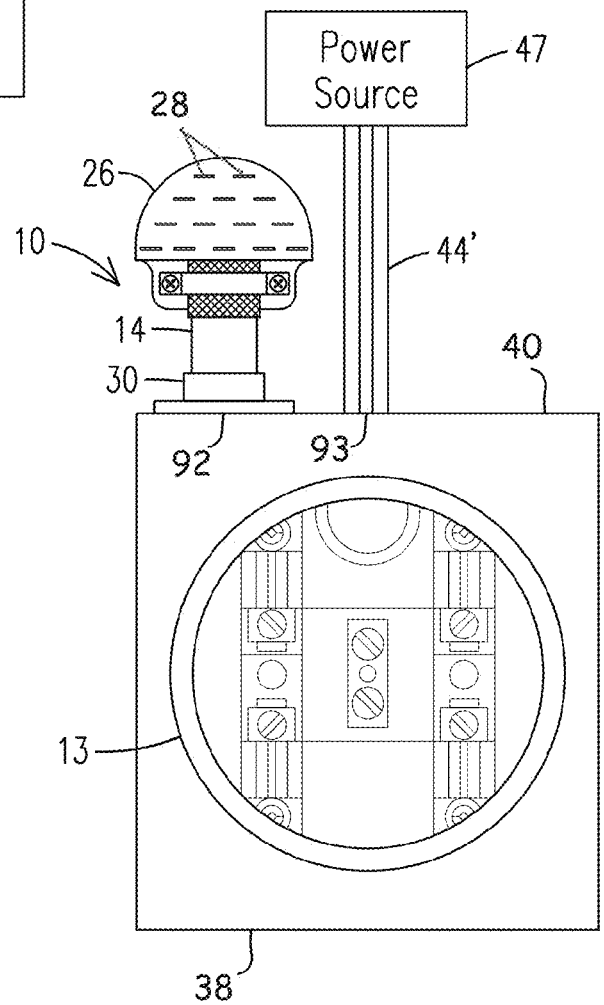
FIG. 5 is a front plan view of a heat dissipation device of the present disclosure for an electrical meter socket connected to an overhead power source.

FIG. 5 illustrates my heat dissipation device 10 mounted to another embodiment of an electrical meter socket 12 that is connected to an overhead power source 47 of an overhead service connection. As appreciated by one skilled in the art, the opening 93 in the top portion 40 of the housing 20 may be used to pass electrical cables 44 from the overhead power source 47. Another, opening 92 can be formed in the top portion 40 of the housing 20. Opening 92 can be formed by removing a knock-out piece or plate, or alternatively by forming a hole in the top portion 40, for example, using a knock-out punch. The heat dissipation device 10 can then be attached to hole 92, for example with a connector 30, such as a hub using self-tapping screws. The heat dissipation device 10 can then dissipate heat from within the housing 20 of the electrical meter socket 12, during the overhead service connection. In a non-limiting example, when the electrical meter socket 12 is connected to the overhead power source 47 through the opening 93, the connector 30 and the heat dissipation device 10 can alternatively be mounted to an opening 43 in a side portion 39 (FIG. 2B) of the housing 20, which can be formed for example by removing the knock-out plate 90. As further illustrated in FIG. 4, the heat dissipation device 10 can include a vent cap 26 secured to a second end 24 of the conduit 14 opposite from the first end 16. The vent cap 26 can include one or more optional apertures 28, to dissipate heat from an interior of the housing 20 of the electrical meter socket 12 and to simultaneously prevent rain water on an outer surface of the vent cap 26 from entering an interior of the vent cap 26.

Figure 6:
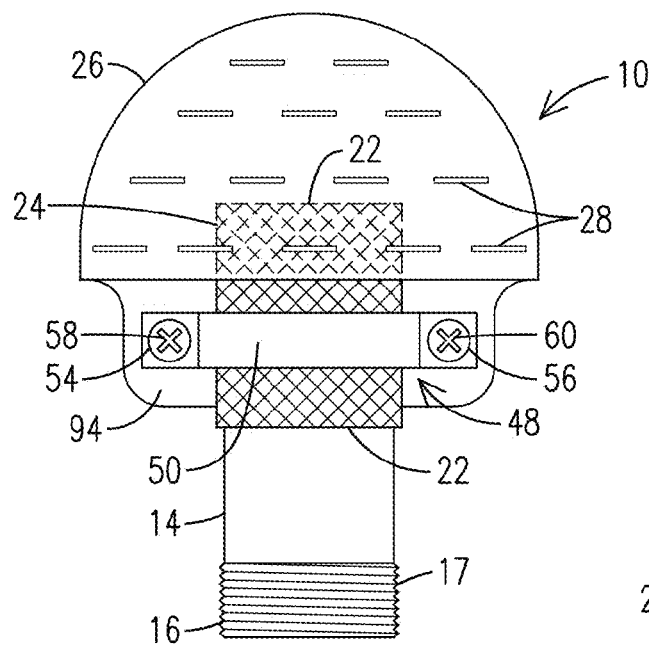
FIG. 6 is an isolated front view of the heat dissipation device of FIGS. 4 and 5.

FIG. 6 illustrates an embodiment of the heat dissipation device 10, including a connector 48 to secure the vent cap 26 to the second end 24 of the conduit 14. In one or more aspects, the connector 48 can be a clamp, such as a pipe clamp. As illustrated in FIG. 6, the connector 48 can include a band 50 to encircle a portion of a circumference of the conduit 14. A pair of openings 54 and 56 in opposing ends of the band 50 can be aligned with a base portion 94 of the vent cap 26. A pair of fasteners 58 and 60 may be passed through the respective openings 54 and 56 of the band 50 and into openings 62 and 64 (FIG. 7) in the base 94 of the vent cap 26. As the fasteners 58 and 60 are passed through the openings 54 and 56 in the band 50 and into the openings 62 and 64 in the base 94 of the vent cap 26, the band 50 may tighten around the circumference of the conduit 14 and secure the vent cap 26 to the conduit 14.

As further illustrated in the embodiment of FIG. 6, the heat dissipation device 10 can include a mesh or screen 22. In a preferred aspect, the mesh or screen 22 can be located in or at the second end 24 of the conduit 14. The mesh or screen 22 may cover the second end 24 of the conduit 14, to prevent insects from entering the second end 24 of the conduit 14. As illustrated in the embodiment of FIG. 6, the mesh or screen 22 may cover the second end 24 of the conduit 14 and may be secured to the conduit 14 by extending down from the second end 24 of the conduit 14 and in between the band 50 and the conduit 14. In a non-limiting example, the mesh or screen 22 may be secured within an interior of the pipe 14 at the second end 24 and the mesh may not need to be secured to an exterior surface of the conduit 14.

Figure 7:
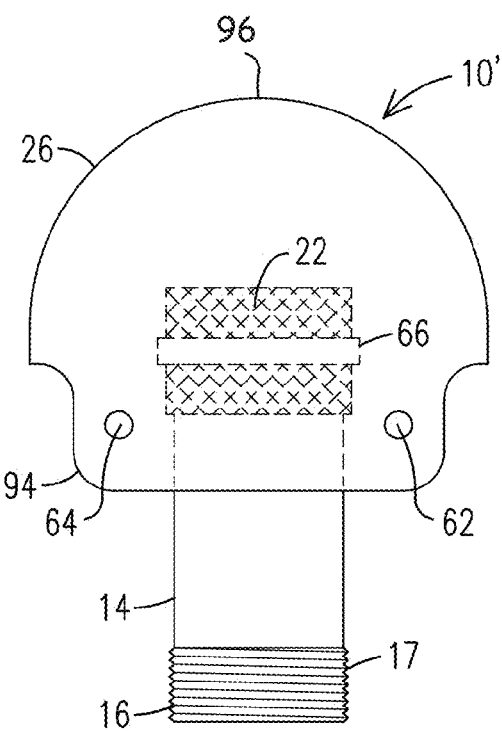
FIG. 7 is an isolated back view of the heat dissipation device of FIGS. 4 and 5.

FIG. 7 illustrates an alternate embodiment of the heat dissipation device 10 including a second connector 66, such as a radiator hose clamp, for example, to secure the mesh or screen 22 to an exterior surface of the pipe 14 at the second end 24. Mesh or screen 22 can be strong enough to resist puncture, but porous enough to allow heat to pass therethrough. In a non-limiting example, the mesh or screen 22 may be 16 gauge stainless steel mesh, 16 gauge aluminum mesh, or 18 gauge fiberglass mesh, to prevent insects such as ants and bees from entering the second end 24 of the pipe 14.

Figure 8:
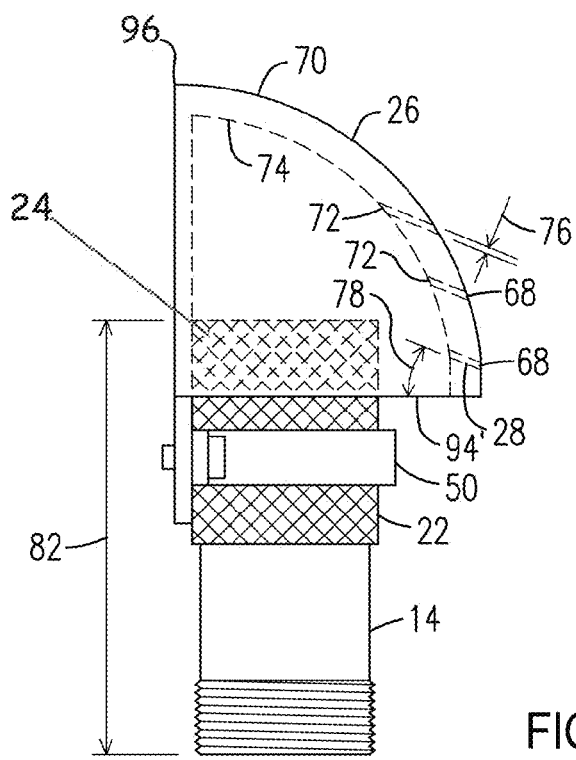
FIG. 8 is a partial isolated side view of the heat dissipation device of FIGS. 4 and 5.

FIG. 8 illustrates a side view of an embodiment of the heat dissipation device 10. A gap 94' can be provided along the base 94 of the vent cap 26 and between conduit 14 and an outer surface 70. Gap 94' can provide the primary venting of heat out from under cap 26. As discussed above, the vent cap 26 can include one or more optional apertures 28 to dissipate heat from an interior of housing 20 of the electrical meter socket 12. The vent cap 26 can also simultaneously prevent rain water along an outer surface of the vent cap 26 from entering an interior of the vent cap 26.

As illustrated in the embodiment of FIG. 8, in order to prevent rain water along an outer surface of the vent cap 26 from entering an interior of the vent cap 26, the one or more apertures 28 may be shaped with a particular configuration. The one or more apertures 28 of the vent cap 26 may extend from a first end 68 at an outer surface 70 of the vent cap 26 to a second end 72 at an inner surface 74 of the vent cap 26. Additionally, as illustrated in the embodiment of FIG. 8, the one or more apertures 28 may be oriented from the first end 68 to the second end 72 in a direction opposite to or away from the second end 24 of the pipe 14 covered by the vent cap 26. Additionally, the one or more apertures 28 may be oriented from the first end 68 to the second end 72 in a direction toward a top 96 of the vent cap 26 or opposite to or away from the base 94 of the vent cap 26. In a non-limiting example, the one or more apertures 28 may be sized with a width 76 in a range of ¼"-½" and may be oriented at an angle 76 in a range of 30-60 degrees, relative to the base 94 of the vent cap 26. Additionally, in a non-limiting example, the conduit 14 may be sized with a height 82 in a range of 3-5" so to provide a chimney effect and dissipate heat from within the interior of the housing 20 of the electrical meter socket 12 through conduit 14 and out through the one or more apertures in vent cap 26.

Figure 9:
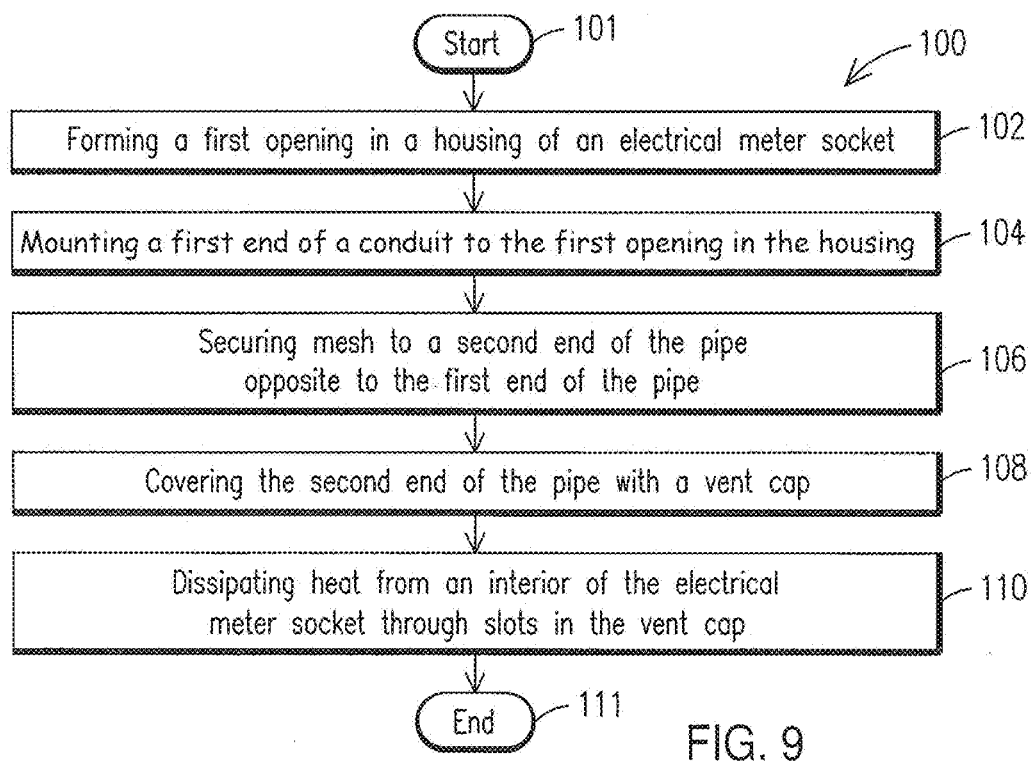
FIG. 9 is a flowchart depicting a method for dissipating heat from an electrical meter socket.

With reference to FIG. 9, shown is a flowchart that represents an embodiment of a heat dissipation process 100 of the present disclosure. The heat dissipation process 100 can be used to dissipate heat from the electrical meter socket 12. As an alternative, the flowchart of FIG. 9 can be viewed as depicting an example of steps of a method. The heat dissipation process 100 starts at box 101. At box 102, the heat dissipation process 100 involves forming an opening in a housing of an electrical meter socket, for example, the opening 92 in the housing 20 of the electrical meter socket 12. At box 104, the heat dissipation process 100 further involves mounting the conduit to the opening, for example, mounting 104 the first end 16 of the conduit 14 to the opening in the housing. In an aspect, the conduit 14 can be mounted to the opening by, for example, attaching a connector 30 to the opening of the meter housing. For example, a hub (such as that in FIG. 3) may be attached to opening 92—in the top 40 of meter housing 20. At box 106, the heat dissipation process 100 further involves optionally securing mesh or screen to an end of the conduit opposite the end mounted to the housing. For example, the mesh 22 may be secured to the second end 24 of the conduit 14 opposite to the first end 16. At box 108, the heat dissipation process 100 involves providing a vent cap 26 covering an end of the conduit with the vent cap. For example, the second end 24 of the conduit 14 may be covered with the vent cap 26. The vent cap may or may not include one or more apertures. At box 110, the heat dissipation process 100 involves dissipating heat from an interior of the electrical meter socket through the vent cap. For example, heat may be dissipated from the interior of the electrical meter socket 12 through the conduit 14 and out from under vent cap 26 and/or through the one or more apertures 28 in the vent cap 26, before ending at 111.

During installation of the heat dissipation device 10, the conduit 14 may be secured to the connector 30, which in-turn can be secured to the housing 20 of the electrical meter socket 12, as described above. During operation of the heat dissipation device 10, heat energy may be generated within the housing 20 of the electrical meter socket 12, during operation of the electrical meter socket 12 and electrical meter 13. This heat energy may pass up through the opening 92 in the housing 20 of the electrical meter socket 12 and into the conduit 14 connected to opening 92, which can create a chimney effect and can dissipate the heat energy out from under vent cap 26 and/or through the one or more apertures 28 of the vent cap 26 secured to the second end 24 of the conduit 14. By continuously dissipating the heat energy from within the housing 20 of the electrical meter socket 12, the heat dissipation device 10 can prevent the temperature within the housing 20 from exceeding a temperature threshold, such as 85° C. (185° F.) that may be used by a monitoring system to generate an alarm.

As will be apparent to those of skill in the art upon reading this disclosure, each of the individual embodiments described and illustrated has discrete components and features which may be readily separated from or combined with the features of any of the other several embodiments without departing from the scope or spirit of the present disclosure. Any recited method can be carried out in the order of events recited or in any other order logically possible.

Disjunctive language such as the phrase "at least one of X, Y, or Z," unless specifically stated otherwise, is understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

While various embodiments of the present invention have been shown and described herein, it will be obvious that such embodiments are provided by way of example only. Numerous variations, changes and substitutions may be made without departing from the invention herein. Accordingly, it is intended that the invention be limited only by the spirit and scope of the appended claims.

The invention claimed is:

1. A heat dissipation device for an electrical meter socket, comprising:
    a hollow conduit substantially vertically disposed above the electrical meter socket, the hollow conduit having a first end and a second end, the first end configured to be mounted to a first opening in a top portion of a housing of the electrical meter socket; and a vent cap connected to and covering the second end of the hollow conduit, the vent cap configured to provide a chimney effect to dissipate heat from an interior of the electrical meter socket through the hollow conduit and out of the vent cap.

2. The heat dissipation device of claim 1, further comprising a mesh or screen to prevent insects from entering the heat dissipation device.

3. The heat dissipation device of claim 1, further comprising a connector configured to mount the conduit to the first opening in the housing.

4. The heat dissipation device of claim 1, further comprising a connector to secure the vent cap to the second end of the conduit.

5. The heat dissipation device of claim 4, wherein the connector securing the vent cap to the second end of the conduit comprises:
a band to encircle a portion of a circumference of the conduit; and
a respective opening in opposing ends of the band; and
a respective fastener passed through the respective opening of the band and into the vent cap.

6. The heat dissipation device of claim 5, further comprising a mesh or screen and wherein the mesh or screen is extended from the band and the second end of the conduit to secure the mesh or screen to the conduit with the connector.

7. The heat dissipation device of claim 1, comprising a mesh or screen and a second connector to secure the mesh or screen to the second end of the conduit.

8. The heat dissipation device of claim 1, wherein the vent cap comprises one or more apertures that extend from a first end at an outer surface of the vent cap to a second end at an inner surface of the vent cap.

9. The heat dissipation device of claim 8, wherein the one or more apertures in the vent cap are sized with a width in a range of ¼"-½" and are oriented at an angle in a range of 30-60 degrees relative to a base of the vent cap.

10. The heat dissipation device of claim 1, wherein the conduit has a tubular shape and an outer diameter in a range of 1"-3" and a height in a range of 3-5".

11. An electrical meter socket system for an advanced metering infrastructure (AMI), comprising:
an electrical meter socket;
a housing for the electrical meter socket, the housing having an opening in a top portion of the housing;
a heat dissipation device, wherein the heat dissipation device comprises:
a hollow conduit having a first end and a second end, the first end coupled to and in communication with the opening in the top portion of the housing, the second end positioned above the first end; and
a vent cap positioned to cover the second end of the conduit and configured to provide a chimney effect to dissipate heat from an interior of the electrical meter socket through the hollow conduit and out the vent cap; and
a connector for connecting the first end of the conduit to the opening in the housing of the electrical meter socket.

12. The electrical meter socket system of claim 11, further comprising a mesh or screen to prevent insects from entering the heat dissipation device.

13. The electrical meter socket system of claim 11, further comprising a second connector to secure the vent cap to the second end of the conduit.

14. The electrical meter socket system of claim 13, wherein the second connector comprises:
a band to encircle a portion of a circumference of the conduit;
a respective opening in opposing ends of the band; and
a respective fastener passed through the respective opening of the band and into the vent cap.

15. The electrical meter socket system of claim 14, further comprising a mesh or screen and wherein the mesh or screen is extended from the band and the conduit to secure the mesh or screen to the conduit with the second connector.

16. The electrical meter socket system of claim 11, wherein the vent cap comprises one or more apertures that extend from a first end at an outer surface of the vent cap to a second end at an inner surface of the vent cap.

17. A method for dissipating heat from an electrical meter socket, comprising:
forming a first opening in a top portion of a housing of the electrical meter socket;
providing a heat dissipation device, the heat dissipation device comprising a hollow conduit having a first end and a second end, and a vent cap;
mounting a first end of the hollow conduit to the first opening such that the second end of the hollow conduit is positioned above the first end of the hollow conduit;
securing mesh or screen to or within the heat dissipation device;
covering the second end of the conduit with the vent cap; and
dissipating heat from an interior of the electrical meter socket through the hollow conduit and through the slots in the vent cap, thereby dissipating heat from the electrical meter socket.

18. The method of claim 17, further comprising:
mounting a first connector to the first opening in the housing; and securing the first end of the hollow conduit to the first opening in the housing using the first connectors.

19. The method of claim 17, further comprising securing the vent cap to the second end of the conduit with a second connector, wherein securing the vent cap comprises:
encircling a portion of a circumference of the conduit with a band; and
passing a respective fastener through a respective opening in opposing ends of the band and into the vent cap.

20. The method of claim 17, further comprising forming one or more apertures in the vent cap from a first end at an outer surface of the vent cap to a second end at an inner surface of the vent cap such that the slots are oriented from the first end to the second end in a direction opposite to the second end of the conduit covered by the vent cap.

* * * * *